(12) United States Patent
JangJian et al.

(10) Patent No.: US 9,356,059 B2
(45) Date of Patent: May 31, 2016

(54) BSI IMAGE SENSOR CHIPS AND METHODS FOR FORMING THE SAME

(75) Inventors: Shiu-Ko JangJian, Tainan (TW); Kei-Wei Chen, Tainan (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 919 days.

(21) Appl. No.: 13/352,980

(22) Filed: Jan. 18, 2012

(65) Prior Publication Data

US 2013/0153901 A1    Jun. 20, 2013

Related U.S. Application Data

(60) Provisional application No. 61/576,231, filed on Dec. 15, 2011.

(51) Int. Cl.
*H01L 29/04* (2006.01)
*H01L 27/146* (2006.01)

(52) U.S. Cl.
CPC ...... *H01L 27/14623* (2013.01); *H01L 27/1464* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 5,882,994 A * | 3/1999 | Araki et al. | 438/593 |
| 7,564,079 B2 | 7/2009 | Mabuchi et al. | |
| 8,415,762 B2 | 4/2013 | Yoshida et al. | |

FOREIGN PATENT DOCUMENTS

| | | |
|---|---|---|
| JP | 09097850 | 4/1997 |
| JP | 2000114393 | 4/2000 |
| JP | 2006261638 | 9/2006 |
| JP | 2008112939 | 5/2008 |

\* cited by examiner

*Primary Examiner* — Jack Chen
(74) *Attorney, Agent, or Firm* — Slater Matsil, LLP

(57) ABSTRACT

A device includes semiconductor substrate having a front side and a backside. A polysilicon layer is disposed on the backside of the semiconductor substrate. The polysilicon layer includes a portion doped with a p-type impurity. A dielectric layer is disposed on the backside of the semiconductor substrate, wherein the polysilicon layer is between the semiconductor substrate and the polysilicon layer.

18 Claims, 6 Drawing Sheets

BSI IMAGE SENSOR CHIPS AND METHODS FOR FORMING THE SAME

This application claims the benefit of the following provisionally filed U.S. Patent Application: Application Ser. No. 61/576,231, filed Dec. 15, 2011, and entitled "BSI Image Sensor Chips and Methods for Forming the Same;" which application is hereby incorporated herein by reference.

BACKGROUND

Backside Illumination (BSI) image sensor chips are replacing front-side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon substrate. The interconnect structure includes a plurality of metal layers including bottom metal layer M1 through top metal layer Mtop. A passivation layer is then formed over the interconnect structure.

The formation of the image sensor chips involves a backside grinding, a p-type impurity implantation, and an anneal. The process is then continued to form backside contact pads, color filters, lenses, and the like, on the backside of the silicon substrate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods of forming backside structures of Backside Illumination (BSI) image sensor wafers/chips are provided in accordance with various embodiments. The intermediate stages in the formation of the BSI image sensor wafers/chips are illustrated. The variations of the embodiments are discussed. Throughout the various views and illustrative embodiments, like reference numbers are used to designate like elements.

Figure 1:
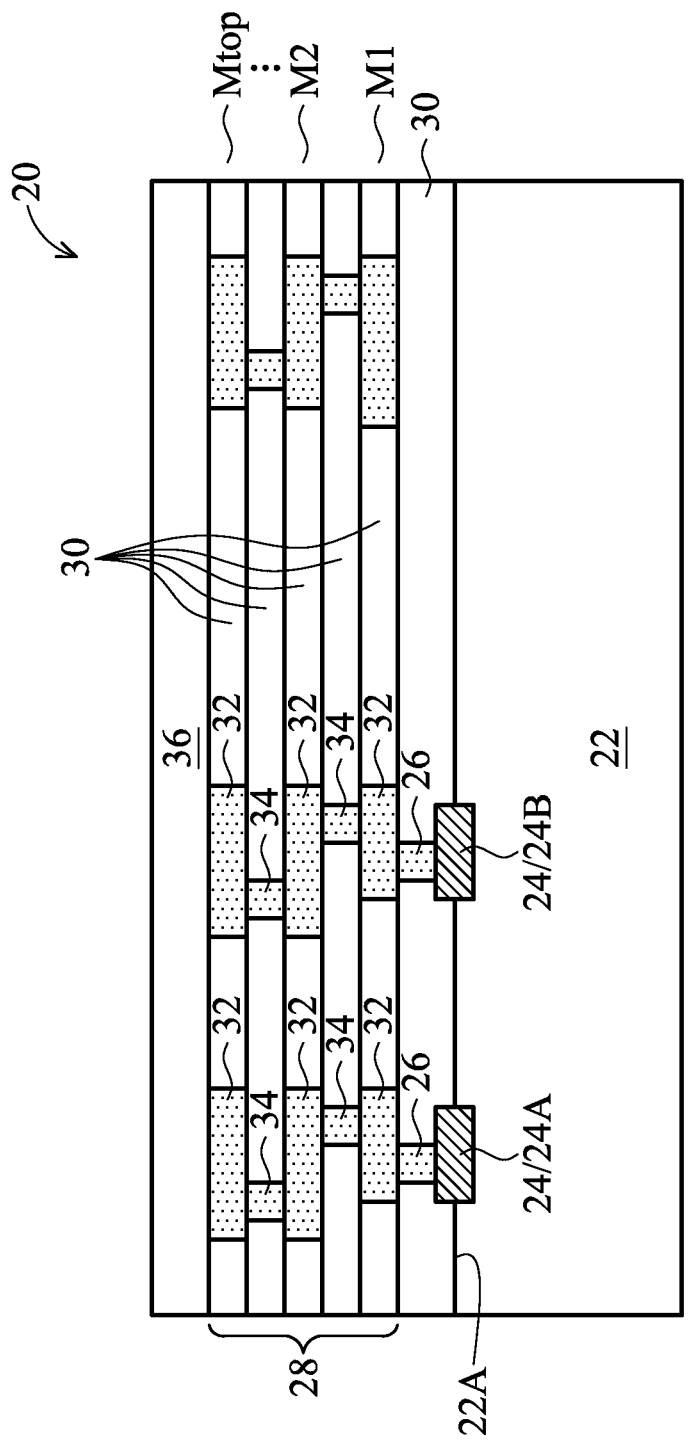
FIGS. 1 through 6 are cross-sectional views of intermediate stages in the manufacturing of a backside illumination (BSI) image sensor wafer in accordance with various embodiments.

FIG. 1 illustrates image sensor wafer 20, which includes semiconductor substrate 22. In some embodiments, semiconductor substrate 22 is a crystalline silicon substrate. Alternatively, semiconductor substrate 22 may be formed of other semiconductor materials. Image sensors 24 (including 24A and 24B) are formed at front surface 22A of semiconductor substrate 22, and may extend from front surface 22A into semiconductor substrate 22. Image sensors 24 may include photo-sensitive transistors and/or photo-sensitive diodes. In addition, core devices such as transistors, which are also illustrated as 24, are formed at the front surface of semiconductor substrate 22. Image sensors 24 are capable of converting light to electrical signals.

Interconnect structure 28 is formed over semiconductor substrate 22, and is used to electrically connect to the devices (such as image sensors 24) in image sensor wafer 20. Interconnect structure 28 includes Inter-Layer Dielectric (ILD) 30 formed over semiconductor substrate 22. Contact plugs 26 are formed in ILD 30, and are electrically coupled to image sensors 24 and the core devices.

The metal layers are marked as M1, M2 . . . and Mtop, wherein metal layer M1 is the bottom metal layer of interconnect structure 28, and metal layer Mtop is the top metal layer of interconnect structure 28. The metal layers include metal lines/pads 32 and vias 34 in dielectric layers 30. Image sensors 24 may be electrically coupled to metal lines/pads 32 and vias 34 in metal layers M1 through Mtop. In some embodiments, dielectric layers 30, in which the metal lines 32 and vias 34 of metal layers M1 through Mtop are formed, are low-k dielectric layers having low k values. The k values of the low-k dielectric layers may be lower than about 3.0 or lower than 2.5. Dielectric layers 30 may also include non-low-k dielectric layers (such as the dielectric layer of Mtop layer) having k values greater than 3.9. Passivation layer 36 is formed over top metal layer Mtop and dielectric layers 30. In some embodiments, passivation layer 36 is formed of an oxide such as un-doped silicate glass (USG). Alternatively, passivation layer 36 may be a composite layer including a silicon oxide layer and a silicon nitride layer on the silicon oxide layer.

Figure 2:
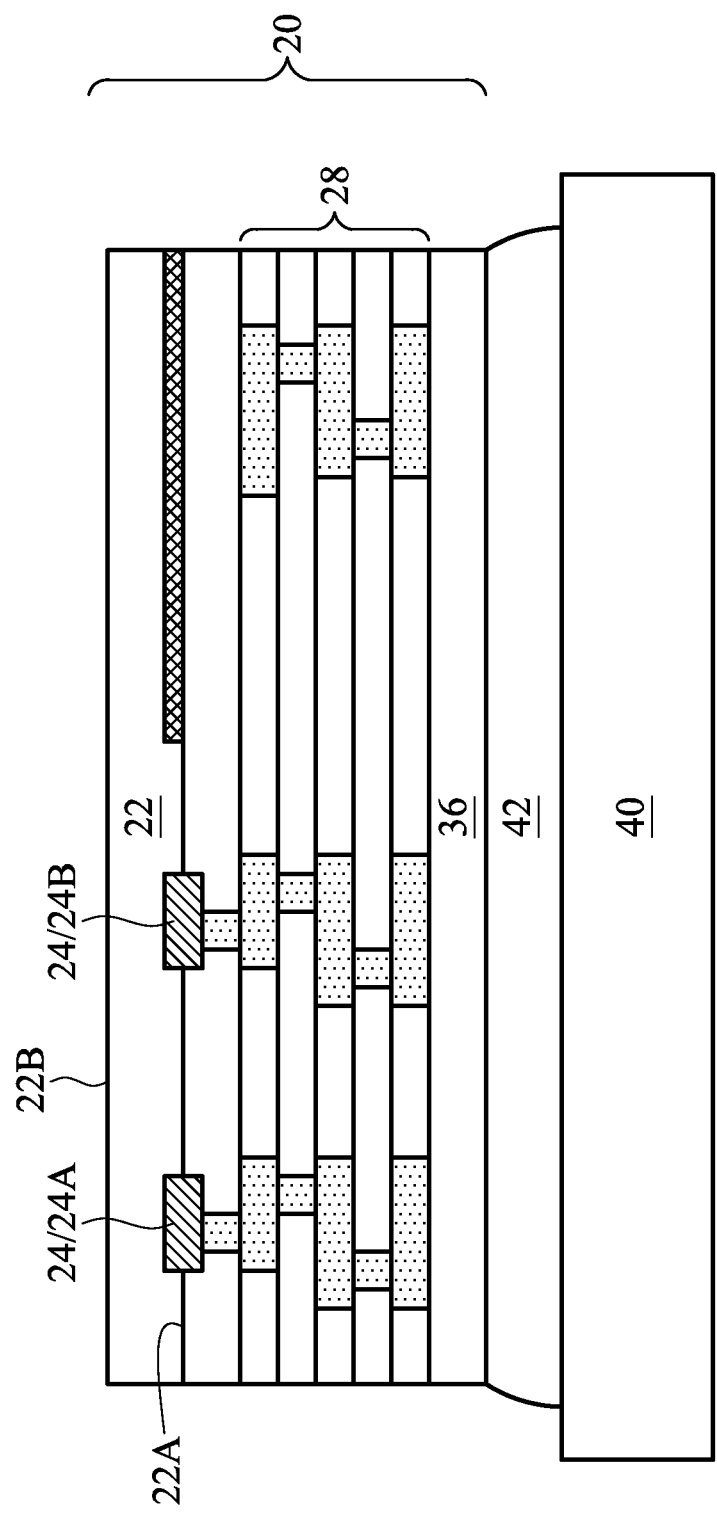

Referring to FIG. 2, the front side (the side with passivation layer 36) of image sensor wafer 20 is attached to carrier 40, for example, through adhesive 42. Carrier 40 may be a glass wafer, and adhesive 42 may be a Ultra-Violet (UV) glue in some exemplary embodiments. The backside of semiconductor substrate 22 thus faces up. A backside grinding is then performed to thin semiconductor substrate 22, so that light may penetrate semiconductor substrate 22 from the backside efficiently. In some embodiments, the remaining thickness of semiconductor substrate 22 is less than about 3 μm, for example.

Figure 3:
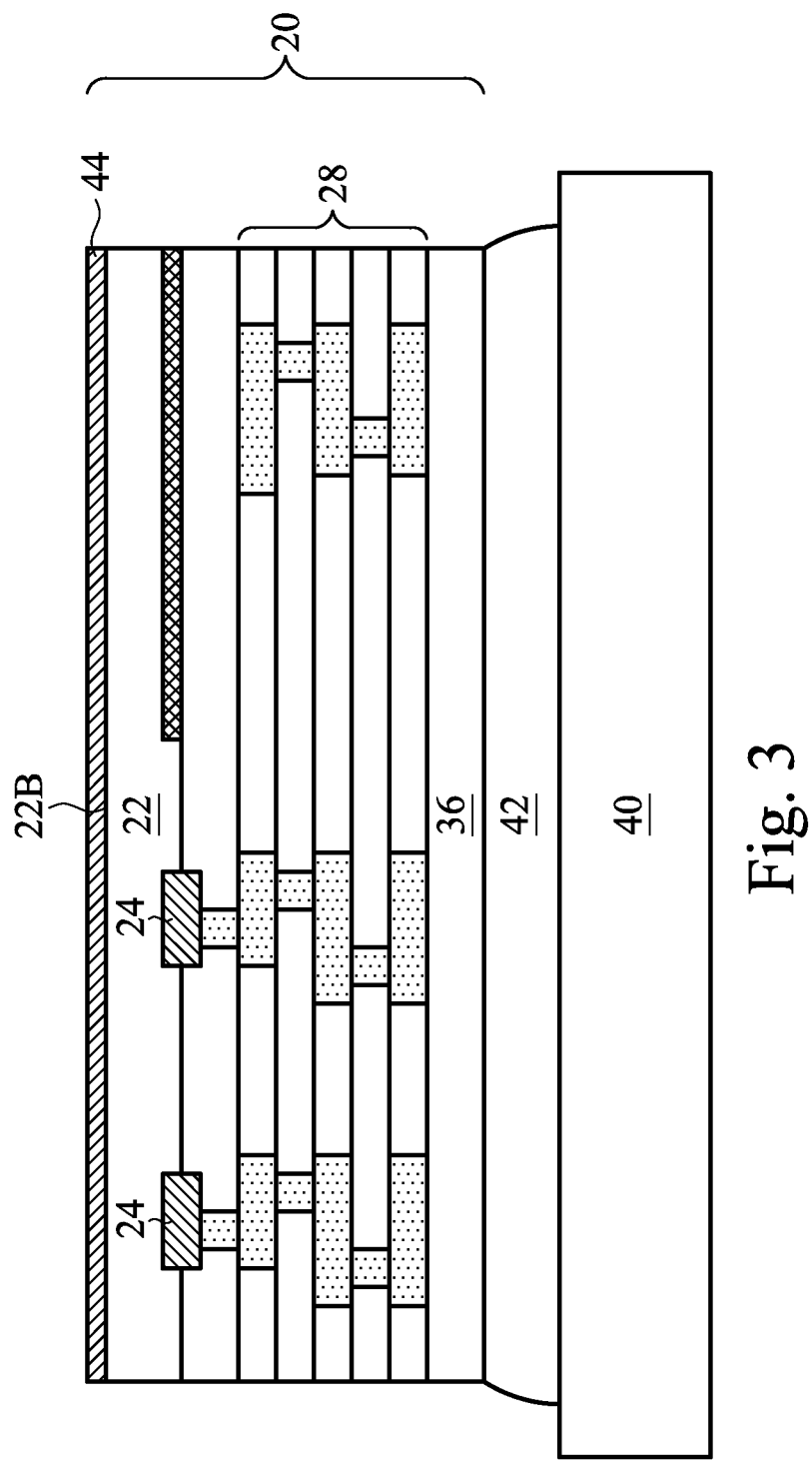

Next, as shown in FIG. 3, a surface treatment is performed on back surface 22B of semiconductor substrate 22. In some embodiments, the surface treatment includes a dry treatment, which may be a furnace treatment performed in a furnace. During the dry treatment, the pressure in the furnace may be close to one atmosphere. Alternatively, the surface treatment is performed in a chamber (not shown). The pressure in the chamber may be lower than one atmosphere, and may be between about 10 Torr and about 380 Torr in some exemplary embodiments. The dry treatment may be free from plasma. The process gases (precursors) used for the surface treatment may include hydrogen ($H_2$). In some embodiments, the process gases are substantially free from additional gases other than hydrogen. In alternative embodiments, additional gases such as nitrogen ($N_2$) may also be included in the process gases. The temperature of wafer 20 during the surface treatment may be lower than about 400° C., and may be between about 25° C. and about 300° C. The duration of the surface treatment may be between about six minutes and about 30 minutes in some exemplary embodiments. When the surface treatment is performed in the chamber, the flow rate of hydrogen may be between about 1,000 sccm and about 6,000 sccm, for example.

In some embodiments, the process gases include a very small amount of oxygen ($O_2$), which may be less than about 1 volume percent, less than about 0.1 volume percent, or less than about 0.01 volume percent. As a result, thin silicon oxide layer 44 is formed. The thickness of thin silicon oxide layer 44 may be smaller than about 10 Å. In alternative embodiments, the process gases are substantially free from oxygen, and hence after the surface treatment, substantially no silicon oxide layer is formed on back surface 22B of semiconductor substrate 22.

Figure 4:
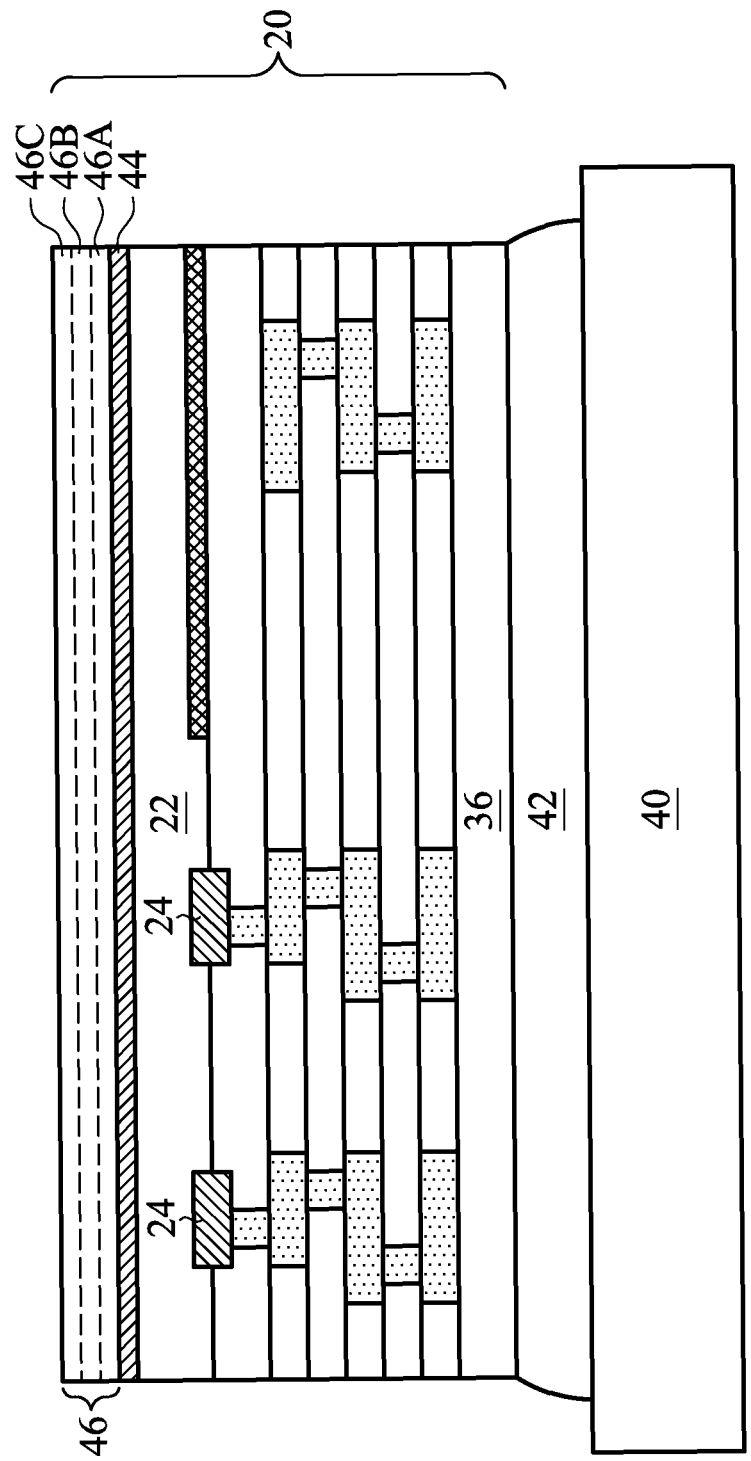

Referring to FIG. 4, a polysilicon deposition is performed to form polysilicon layer 46. In some embodiments, the polysilicon deposition is performed using a Chemical Vapor Deposition (CVD) method such as Low-Pressure CVD (LPCVD) or another applicable method. In accordance with some exemplary embodiments, the thickness of polysilicon layer 46 is greater than about 50 Å, and may be between about 100 Å and about 500 Å, for example, although greater or smaller thicknesses may also be adopted. It is realized, however, that the dimensions recited throughout the description are merely examples, and may be changed to different values.

During the polysilicon deposition, a p-type impurity, which may be boron, indium, or combinations thereof, may be in-situ doped with the proceeding of the polysilicon deposition process. The concentration of the p-type impurity in polysilicon layer 46 is between about $1E15/cm^3$ and about $9E19/cm^3$, for example. In accordance with some embodiments, polysilicon layer 46 has a sandwich structure, which includes bottom layer 46A, middle layer 46B, and top layer 46C. Bottom layer 46A and top layer 46C may have a p-type impurity concentration lower than the p-type impurity concentration of middle layer 46B. In some exemplary embodiments, bottom layer 46A and top layer 46C are free (or substantially free) from p-type impurities. Middle layer 46B, on the other hand, comprises the p-type impurity. In these embodiments, the concentration of middle layer 46B may be greater than about $1E15/cm^3$, and bottom layer 46A and top layer 46C that are substantially free from the p-type impurity may have a p-type impurity concentration lower than about $9E19/cm^3$. Accordingly, during the deposition of bottom layer 46A and top layer 46C, the p-type impurity source (the gas comprising the p-type impurity) may be turned off, and the p-type impurity is not introduced into bottom layer 46A and top layer 46C. When middle layer 46B is formed, the p-type impurity source is turned on, and the p-type impurity is introduced into the deposition chamber for forming polysilicon layer 46.

Middle layer 46B may have a substantially uniform p-type impurity distribution at a time immediately after the formation of polysilicon layer 46. Alternatively, middle layer 46B may have a gradient p-type impurity distribution, wherein the middle portion of middle layer 46B having higher p-type impurity concentration than the upper portion and the lower portion of middle layer 46B.

Figure 5:
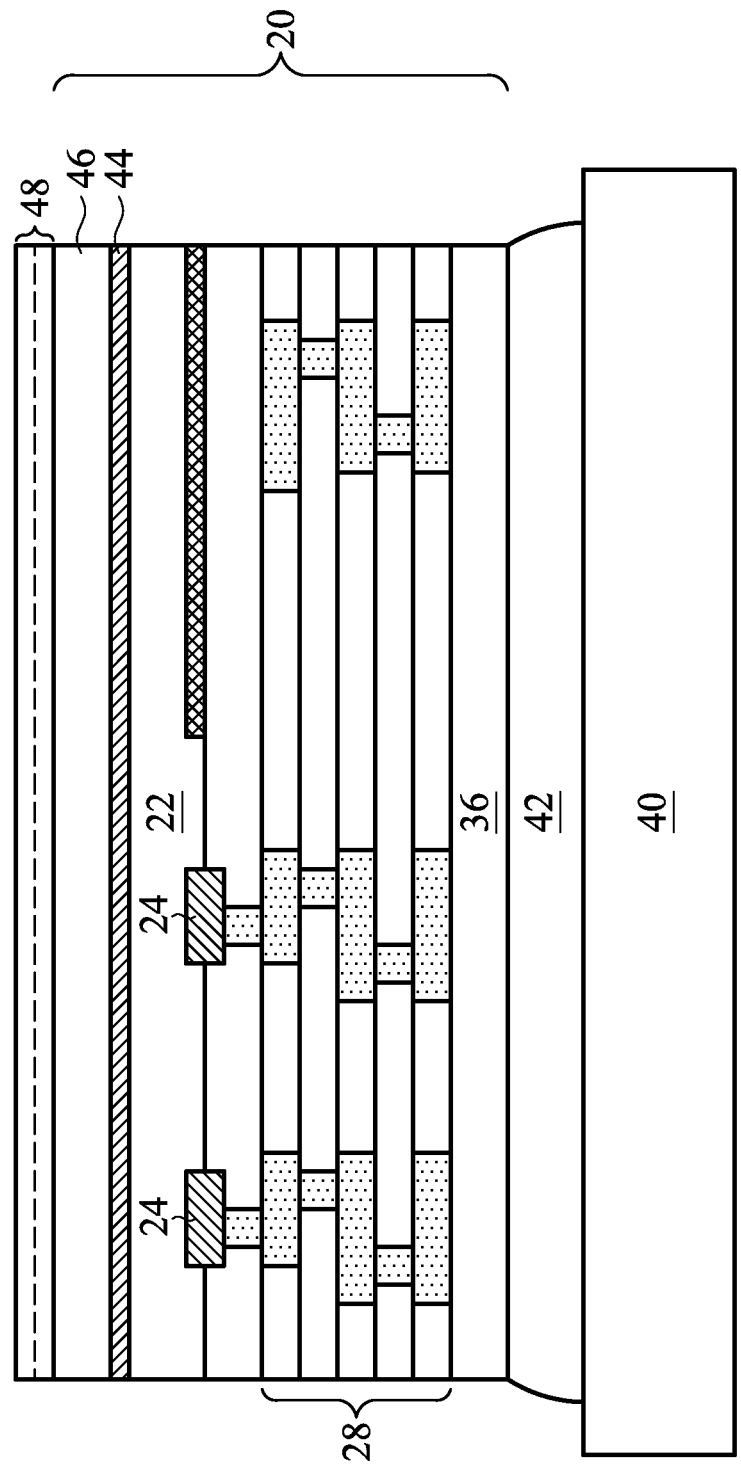

Referring to FIG. 5, after the surface treatment, dielectric layer(s) 48 are formed, and are in contact with polysilicon layer 46. In some embodiments, dielectric layers 48 have refractive index greater than about 2. Dielectric layers 48 may also include a high-k dielectric material, which may include silicon carbide, silicon oxycarbide, a hafnium-based oxide, an aluminum-based oxide, a lanthanum-based oxide, combinations thereof, and multilayers thereof. Dielectric layers 48 may be formed using a CVD method, which may be Plasma Enhanced Chemical Vapor Deposition (PECVD).

Figure 6:
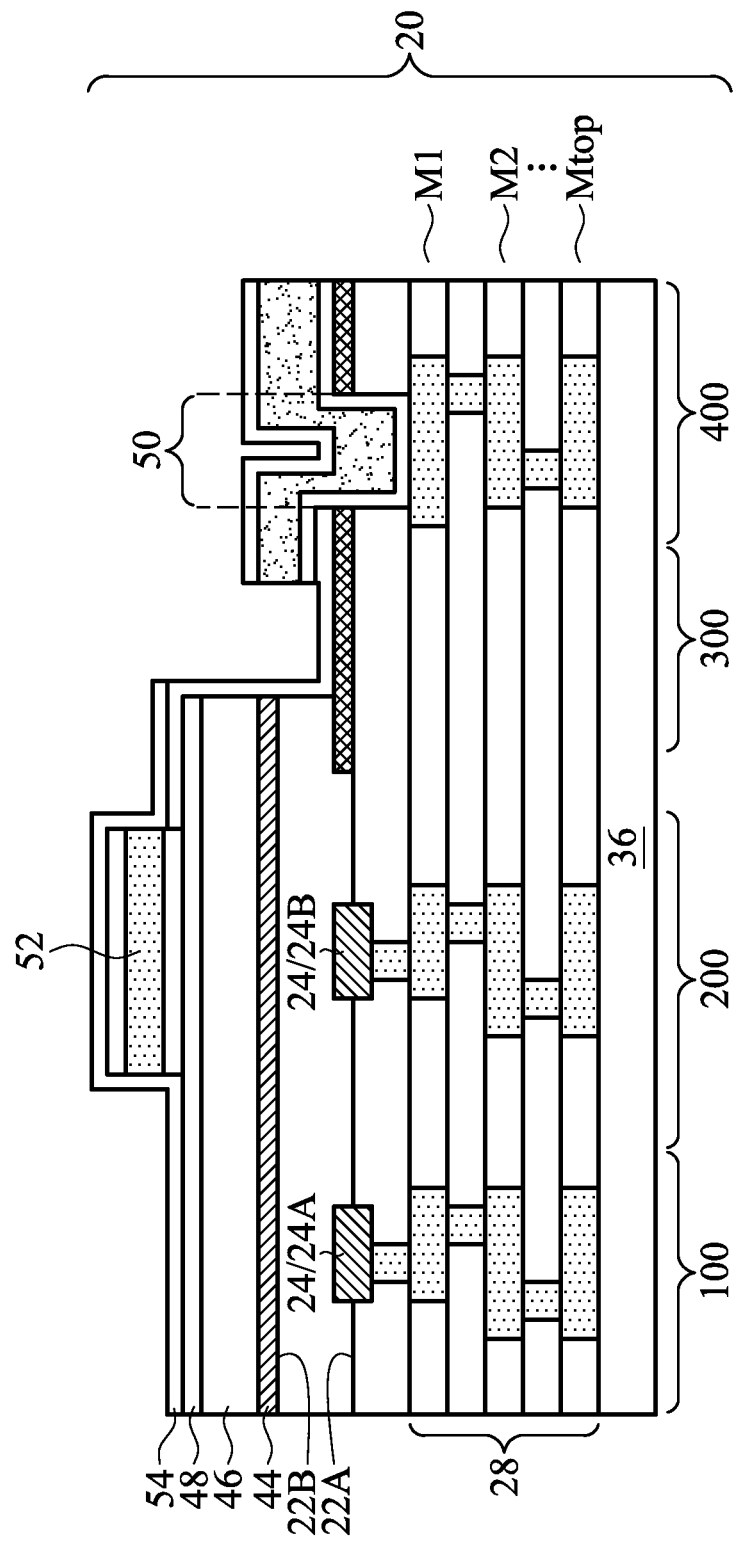

FIG. 6 illustrates the formation of remaining portions of the BSI structure. The formation processes may include performing etching steps to remove portions of dielectric layers 48, polysilicon layer 46, thin silicon oxide layer 44, and substrate 22 from scribe line regions 300 and pad regions 400. Furthermore, after the etching steps, openings are formed in substrate 22, and extend from back surface 22B to front surface 22A of semiconductor substrate 22. Electrical pad 50 is formed in the opening. Electrical pad 50 is used for forming an electrical connection, such as a wire bonding (not shown), to electrically couple to the circuits and image sensors 24. Electrical pad 50 may be coupled to image sensors 24 through interconnect structure 28.

As also shown in FIG. 6, metal shielding layer 52 is formed, and is then patterned. As a result, metal shielding layer 52 is removed from over active image sensor pixel region 100, which includes image sensor 24A at front surface 22A of semiconductor substrate 22. A portion of metal shielding layer 52 is over and aligned to black reference pixel region 200, which includes black reference image sensor 24B formed therein. Black reference image sensor 24B is used for calibrating the signals generated by active image sensors such as 24A. In some embodiments, metal shielding layer 52 comprises aluminum copper, although other metals such as silver, nickel, or the like, may also be used. FIG. 6 also illustrates the formation of passivation layer 54, which is formed in active image sensor pixel region 100 and black reference pixel region 200 as a top dielectric layer.

In accordance with embodiments, the introduction of the p-type impurity to the backside of semiconductor substrate 22 is performed through the in-situ doping, which is performed when the polysilicon layer is formed. Accordingly, the profile of the p-type impurity is well controlled. In some embodiments, the process steps after the formation of the polysilicon layer are low-temperature processes that are performed, for example, at lower than about 400° C. Accordingly, the profile of the p-type impurity concentrations in layers 46A, 46B, and 46C are well preserved. In addition, since the introduction of the p-type impurity is through in-situ doping, no damage to substrate 22 is resulted, and hence no annealing is needed to fix the damage.

In the embodiments, a device includes semiconductor substrate having a front side and a backside. A polysilicon layer is disposed on the backside of the semiconductor substrate. The polysilicon layer includes a portion doped with a p-type impurity. A dielectric layer is disposed on the backside of the semiconductor substrate, wherein the polysilicon layer is between the semiconductor substrate and the polysilicon layer.

In accordance with other embodiments, a device includes a semiconductor substrate, a first and a second image sensor at a front surface of the semiconductor substrate, and an oxide layer over and contacting a back surface of the semiconductor substrate. A polysilicon layer is disposed over the oxide layer, wherein the polysilicon layer includes a p-type impurity. A metal shielding layer is disposed over the polysilicon layer, wherein the metal shielding layer is over and aligned to the first image sensor. A passivation layer is disposed over the metal shielding layer.

In accordance with yet other embodiments, a method includes grinding a backside of a semiconductor substrate, wherein a remaining portion of the semiconductor substrate has a back surface. A polysilicon layer is deposited over the back surface of the semiconductor substrate, wherein the polysilicon layer is on a backside of the semiconductor substrate. During the step of depositing the polysilicon layer, a p-type impurity is in-situ doped into the polysilicon layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate comprising a front side and a backside;
a metal pad in a metallization layer and on the front side of the semiconductor substrate;
a polysilicon layer on the backside of the semiconductor substrate, wherein the polysilicon layer comprises:
a bottom layer;
a middle layer; and
an upper layer, wherein the middle layer is between the bottom layer and the upper layer, wherein the middle layer is doped with a p-type impurity having a first concentration, and wherein second concentrations of the p-type impurity in the bottom layer and the upper layer are lower than the first concentration;
a dielectric layer on the backside of the semiconductor substrate, wherein the polysilicon layer is between the semiconductor substrate and the dielectric layer;
a recess extending from a back surface of the semiconductor substrate to penetrate through the semiconductor substrate, wherein the polysilicon layer extends to an edge of the recess; and
an electrical pad extending into the recess, wherein the electrical pad contacts the metal pad on the front side of the semiconductor substrate.

2. The device of claim 1 further comprising a first image sensor disposed on the front side of the semiconductor substrate.

3. The device of claim 2 further comprising:
a second image sensor disposed on the front side of the semiconductor substrate; and
a metal shielding layer over and aligned to the first image sensor, wherein the second image sensor is not aligned to the metal shielding layer, and wherein the polysilicon layer is between the metal shielding layer and the semiconductor substrate, and is aligned to the first image sensor and the second image sensor, and the dielectric layer is between the metal shielding layer and the polysilicon layer, and the dielectric layer extends beyond opposite sidewalls of the metal shielding layer.

4. The device of claim 1 further comprising an oxide layer between and contacting a back surface of the semiconductor substrate and the polysilicon layer, wherein the oxide layer comprises an oxide of the material of the semiconductor substrate.

5. The device of claim 1, wherein the bottom layer and the upper layer are substantially free from the p-type impurity.

6. The device of claim 1, wherein the electrical pad is separated from the edge of the recess by a space.

7. A device comprising:
a semiconductor substrate;
a first and a second image sensor at a front surface of the semiconductor substrate;
an interconnect structure on a front side of the semiconductor substrate, wherein the interconnect structure comprises a metal pad and a via connected to the metal pad;
an oxide layer over and contacting a back surface of the semiconductor substrate, wherein the oxide layer is on a backside of the semiconductor substrate;
a polysilicon layer over the oxide layer, wherein the polysilicon layer comprises a p-type impurity;
a metal shielding layer over the polysilicon layer, wherein the metal shielding layer is over and aligned to the first image sensor; and
a passivation layer over the metal shielding layer;
a recess penetrating through the semiconductor substrate, wherein the polysilicon layer extends to an edge of the recess; and
an electrical pad having a portion in the recess, wherein the electrical pad contacts the metal pad.

8. The device of claim 7, wherein the p-type impurity is distributed to substantially an entirety of the polysilicon layer.

9. The device of claim 7, wherein the p-type impurity is distributed to a middle layer of the polysilicon layer, and wherein an upper layer and a bottom layer of the polysilicon layer are substantially free from p-type impurities, and wherein the upper layer and a bottom layer are overlying and underlying the middle layer, respectively.

10. The device of claim 7 further comprising a dielectric layer between the metal shielding layer and the polysilicon layer, wherein the dielectric layer and the metal shielding layer have edges aligned with each other.

11. The device of claim 7, wherein the oxide layer comprises an oxide of the material of the semiconductor substrate, and wherein the oxide layer is in physical contact with the back surface of the semiconductor substrate.

12. The device of claim 7, wherein the metal shielding layer comprises aluminum copper.

13. The device of claim 7, wherein the electrical pad is separated from the edge of the recess by a space.

14. A device comprising:
a semiconductor substrate comprising a front side and a backside;
a metal pad on the front side of the semiconductor substrate;
a polysilicon layer on the backside of the semiconductor substrate, wherein the polysilicon layer comprises a p-type impurity, with a middle portion having a gradient p-type impurity distribution, and having a highest p-type impurity concentration, and an upper portion higher than the middle portion and a lower portion lower than the middle portion, with the upper portion and the lower portion having p-type impurity concentrations lower than an impurity concentration of the middle portion;
a dielectric layer on the backside of the semiconductor substrate, wherein the dielectric layer is between the semiconductor substrate and the polysilicon layer;
a recess extending from a back surface of the semiconductor substrate to penetrate through the semiconductor substrate, wherein both the polysilicon layer and the dielectric layer extend to an edge of the recess; and
an electrical pad having a portion in the recess, wherein the electrical pad contacts the metal pad.

15. The device of claim 14 further comprising:
a passivation layer contacting a sidewall of the polysilicon layer, wherein the passivation layer comprises a dielectric material, and penetrates through the semiconductor substrate.

16. The device of claim 14 further comprising:
an image sensor in the semiconductor substrate; and
a metal shielding layer over the polysilicon layer, wherein the metal shielding layer is over and aligned to the image sensor.

17. The device of claim 16 further comprising an additional dielectric layer over and contacting the polysilicon layer, wherein the additional dielectric layer extends beyond opposite sidewalls of the metal shielding layer.

18. The device of claim 14, wherein the electrical pad is separated from the edge of the recess by a space.

* * * * *